United States Patent

Liao et al.

[11] Patent Number: 6,075,281
[45] Date of Patent: Jun. 13, 2000

[54] MODIFIED LEAD FINGER FOR WIRE BONDING

[75] Inventors: Kuang-Ho Liao; Tsung-Chieh Chen, both of Taipei; Chuen-Jye Lin, Taichung, all of Taiwan

[73] Assignee: Vanguard International Semiconductor Corporation, Hsinchu, Taiwan

[21] Appl. No.: 09/281,673

[22] Filed: Mar. 30, 1999

[51] Int. Cl.[7] .......................... H01L 23/495; H01L 23/48; H01L 23/52; H01L 29/40; H05K 5/02

[52] U.S. Cl. .......................... 257/666; 257/672; 257/673; 257/780; 257/784

[58] Field of Search .................................... 257/666, 672, 257/673, 780, 784; 361/813

[56] References Cited

FOREIGN PATENT DOCUMENTS

| | | | |
|---|---|---|---|
| 58-95833 | 6/1983 | Japan | 257/666 |
| 1-23544 | 1/1989 | Japan | 257/666 |

*Primary Examiner*—David Hardy
*Assistant Examiner*—Jhihan B. Clark
*Attorney, Agent, or Firm*—Tung & Associates

[57] ABSTRACT

A lead frame equipped with modified lead fingers which have inclined tip portions for achieving an improved wire bond is provided. The inclined tip portions on the lead fingers can be formed in a stamping process with an angle on a top surface of the inclined tip portion measured at smaller than 30° from a horizontal plane of the lead finger. It is preferred that the inclined angle should be between about 5° and about 30°, and more preferred that the angle should be between about 5° and about 20°. A wedge bond formed on the inclined tip portion of a lead finger has improved thickness and thermal stress endurance. The thermal stress endurance may be improved by at least 20% and preferably by at least 50% when tested in a thermal cycling test between 150° C. and −65° C.

14 Claims, 3 Drawing Sheets

Fig. 1.B
(Prior Art)

MODIFIED LEAD FINGER FOR WIRE BONDING

FIELD OF THE INVENTION

The present invention generally relates to semiconductor devices and a method for fabricating and more particularly, relates to a semiconductor device that is formed by wire bonding an IC die to lead fingers of a lead frame wherein the fingers are provided with an inclined top surface to improve the thermal stress resistance of a wedge bond and a method for fabricating such semiconductor devices.

BACKGROUND OF THE INVENTION

In the fabrication of semiconductor devices, an important step is to provide electrical communication between an integrated circuit (IC) chip or die and the outside world. The communication may be established by a variety of packaging methods for the IC chip, for instance, wire bonding the IC chip with lead fingers on a lead frame, flip-chip bonding an IC die directly with lead fingers by solder bumps, etc. The wire bonding process for connecting an IC die to a lead frame has been widely used in the packaging of IC devices.

In the wire bonding process, a lead frame fabricated of a thin piece of metal such as copper or copper alloy is first provided. The lead frame may be patterned by a lithographic process to inform a multiplicity of lead fingers emanating from an outer frame toward a center of the lead frame. At the center of the lead frame, a die paddle which is a larger piece of the lead frame is also formed to provide a base for mounting an IC die thereto. A chemical etching process is normally utilized to form the multiplicity of lead fingers such that each of the finger has a base portion that is integral with the outer frame of the lead frame and a tip portion extending inwardly toward the center of the lead frame. The tip portions of the lead fingers are coined, or mechanically compressed in a final step to form a specific configuration of the tip portions. For instance, the tip portions normally bend into a flat portion forming a bonding site for wire bonding.

An automated wire bonding process is frequently used for providing electrical connection between an IC die and a lead frame. In the process, a high conductivity, thin metal wire such as one made of gold is used for the connection for achieving minimum resistance in the communication with the IC die. A capillary which is a wire bonding device with a wire threaded therein is used to plant a gold wire first on a bond pad on the surface of the IC die and then to the tip portion of a lead finger. A wedge bond with the leveled, top surface of the tip portion of the lead finger is thus formed. During the process of forming the wedge bond, the tip of the capillary automatically cuts off the wire supply such that it is ready for the next bond pad wiring connection The wedge bond formed on the lead fingers must exhibit a minimum bond strength requirement and furthermore, it must survive various adverse service environments for the IC package.

The IC die after wire bonded to a lead frame, is most likely encapsulated in a plastic molding compound. The encapsulation process can be performed in a plastic injection molding machine by positioning the IC die and the lead frame in a mold cavity. A plastic compound such as epoxy having a melt temperature of about 175° C. is then injected into the mold cavity forming the encapsulation. The wedge bond formed between the bonding wire and the lead finger is therefore directly exposed to such high temperature or thermal shock. After the molding process is completed the molded package is removed from the mold cavity and allowed to cool down to room temperature. A high thermal stress is therefore exerted on the various bonding sites in the package, i.e., the various wedge bonds formed between the wires and the lead fingers, caused by the sudden temperature change and furthermore, by the shrinkage of the molding compound that surrounds the wedge bond. When the wedge bond is not formed with a high bond strength, the bond frequently fails in a phenomenum known as "second bond open" and thus causing the malfunction of the IC package.

In order to ensure the reliability of IC packages fabricated IC packages are tested in a standard reliability test known as the JEDEC thermal cycle test. In the JEDEC thermal cycle test, a temperature loading from 150° C. to −65° C. is performed on an IC package to qualify its resistance to thermal stress. Many IC packages do not pass the test due to a failure of the wedge bond formed between the bonding wire and the lead fingers, i.e., due to the second bond open defect.

FIG. 1 shows an enlarged, perspective view of a conventional lead frame 10, an IC die 12 and a heat sink 14. The lead frame 10 is constructed of an outer frame 16 which has a plurality of lead fingers 20 emanating from the outer frame 16 each equipped with a tip portion 22. It is seen that the lead fingers 20 and the die paddle support 24 for supporting a die paddle 26 are formed in a slope such that the die paddle 26 is at a plane below the plane of the outer frame 16. The tip portions 22 are formed in a stamping process into a coined area which is in the same plane as the die paddle 26. The die paddle 26 is further provided with apertures 32 for easier assembly of the IC die 12 to the heat sink 14 by adhesive means. The lead frame 10 is normally formed by a thin piece of metal such as copper or a copper alloy.

An enlarged, cross-sectional view of the lead frame 10, the IC die 12 and the heat sink 14 after a wire bonding and a plastic encapsulation process is shown in FIG. 1A. The tip 22 of the lead fingers 20 are connected to bond pads (not shown) on the IC die 12 by a highly conductive metal wire 34 after the IC die 12, the die paddle 26 and the heat sink 14 are first bonded together by adhesive layers 18. The adhesive layers 18 may be formed of an adhesive that is a metal particle filled thermoset material for providing improved heat transfer from the IC die 12. The wire bonded assembly is then positioned in a plastic molding cavity (not shown) and a plastic molding compound 36 is injected into the cavity to form the IC package 30.

An enlarged, detailed view of the wire bond formed between the IC die 12 and the lead finger 20 is shown in FIGS. 1B and 1C. As shown in FIG. 1B, a bond pad 38 is provided in a top surface 28 of the IC die 12 for providing electrical communication through a high conductivity wire 34 with the tip portion 22 of the finger lead 20. A more detailed view of the wedge bond 40 formed by the bonding wire 42, i.e., a gold wire is shown in FIG. 1C. A wire bonding ball 44 is also formed by the gold wire when the wire strikes the surface of the bonding pad 38. The wedge bond 40 formed on a leveled surface 46 on the tip portion 22 may not survive a thermal cycling test due to its high thermal stress.

It is therefore an object of the present invention to provide a lead frame for forming an improved wire bonded IC package that does not have the drawbacks or shortcomings of the conventional wire bonded IC packages.

It is another object of the present invention to provide a lead frame that is equipped with improved lead fingers capable of surviving a thermal cycling test after bonding to an IC die.

It is a further object of the present invention to provide a lead frame that has improved lead fingers with inclined tip portions for achieving improved wire bonding with an IC die.

It is another further object of the present invention to provide a lead frame that is equipped with lead fingers having tip portions formed of an inclined top surface with an angle smaller than 30° when measured from a horizontal plane of the lead finger.

It is still another object of the present invention to provide a lead frame equipped with lead fingers that have an inclined tip portions with a top surface that is formed with an angle between about 5° and about 20° when measured from a horizontal plane of the lead finger.

It is yet another object of the present invention to provide an integrated circuit package that has an IC chip bonded to a lead frame by utilizing a lead frame equipped with lead fingers each having an inclined tip portion forming an angle of not more than 30° when measured from a horizontal plane of the lead finger.

It is still another further object of the present invention to provide an integrated circuit package that has an IC chip bonded to a lead frame wherein the lead frame has lead finger with inclined tip portions such that after a gold wire is bonded to the inclined tip portion forming an interface, a thermal stress occurring at the interface is reduced by at least 20% when compared thermal stress obtained on lead fingers that have non-inclined tip portions.

It is yet another further object of the present invention to provide a method for establishing electrical communication between a lead frame and an IC die by providing a lead frame that has a plurality of lead fingers each equipped with a sloped tip portion having a top surface forming an angle of less than 30° with a horizontal plane of the lead finger, and bonding the sloped tip portion to a bond pad on the IC die by a high conductivity wire.

SUMMARY OF THE INVENTION

In accordance with the present invention, a lead frame that has lead fingers formed with an inclined tip portion to achieve improved wire bonding is provided.

In a preferred embodiment, a lead frame equipped with lead fingers that have inclined tip portions for improved wire bonding is provided which includes an outer frame that has a plurality of lead fingers emanating therefrom and a plurality of lead fingers each having a base portion integral with the outer frame and a tip portion extending inwardly toward a center of the lead frame, tip portion has a top surface that is formed with an angle smaller than 30° when measured from a horizontal plane of the lead finger.

The tip portion of the lead fingers may have a top surface that is formed with an angle between about 5° and about 30° when measured from a horizontal plane of the lead finger. The tip portion of the lead fingers may also have a top surface that is formed preferably with an angle between about 5° and about 20° when measured from a horizontal plane of the lead finger. The angle of the top surface of the tip portion may be formed in a stamping process. The inclined tip portion of the lead finger is bonded to a gold wire in a wire bonding process. The inclined tip portion of the lead finger reduces thermal stress by at least 20% at an interface formed between a subsequently bonded gold wire and the inclined tip portion during a thermal cycling test conducted between 150° C. and −65° C. The inclined tip portion of the lead finger reduces the thermal stress preferably by at least 50%. The lead frame may be formed of a copper or a copper alloy material.

In another preferred embodiment, an integrated circuit chip package that has an IC chip bonded to a lead frame is provided which includes a lead frame that has a plurality of lead fingers emanating from the frame, each of the lead fingers has an inclined tip portion forming an angle of not more than 30° when measured from a horizontal plane of the lead finger, an IC chip that has a plurality of bond pads provided on a top surface, a plurality of high conductivity wires providing electrical communication between each of the inclined tip portion of the lead fingers with a corresponding bond pad on the chip, and a plastic encapsulation compound encasing the lead frame and the IC chip.

The inclined tip portion of the lead finger forms an angle between about 5° and about 20° when measured from a horizontal plane of the lead finger. The inclined tip portion forms an angle with a horizontal plane of the lead finger that is sufficiently large such that after a high conductivity wire is bonded to the inclined tip portion forming an interface, a thermal stress occurring at the interface is reduced by at least 20% when compared to data obtained on a non-inclined tip portion during a thermal cycling test conducted between about 175° and about −65° C. The lead fingers may be formed by an etching process and the inclined tip portions may be formed by a stamping process. The lead frame may be formed of a copper or a copper alloy by an etching process. The high conductivity wires which provide electrical communication between each of the inclined tip portions and a corresponding bond pad on the chip are gold wires.

The present invention is further directed to a method for providing electrical communication between a lead frame and an IC die comprising the steps of first providing an IC die which has a plurality of bond pads formed on top, then providing a lead frame that has a plurality of lead fingers emanating therefrom each having a sloped tip portion and a top surface forming angle of less than 30% with a horizontal plane of the lead finger, and bonding a first end of a high conductivity wire to a bond pad on the IC die and a second end to a corresponding sloped tip portion on the lead finger.

The sloped tip portion has a top surface forming an angle between about 5° and about 20° with a horizontal plane of the lead finger. A bond formed between the second end of the high conductivity wire and the sloped tip portion on the lead finger has a thermal stress that is at least 20% less during a thermal cycling test conducted between about 150° C. and −65° C. when compared to a thermal stress obtained on a lead finger with non-sloped tip portion. The method may further include the step of encapsulating the IC die, the lead frame and the high conductivity wire in a plastic molding compound. The method may further include the step of forming the sloped tip portion the lead finger by a stamping process. The method may still further include the step of forming the lead fingers in the lead frame by a chemical etching process.

BRIEF DESCRIPTION OF THE DRAWINGS

These and other objects, features and advantages of the present invention will become apparent from the following detailed description and the appended drawings in which:

FIG. 1B is an enlarged, cross-sectional view showing a conventional wire bond established between a bond pad on an IC die and a leveled tip portion of a lead finger.

DETAILED DESCRIPTION OF THE PREFERRED EMBODIMENT

The present invention discloses a lead frame that is equipped with lead fingers which have an inclined or sloped tip portion for achieving improved wire bonding with an IC die. A wedge bond formed with the inclined tip portion on a lead finger has greatly improved thermal stress endurance when compared to a wedge bond formed on a leveled tip portion of a lead finger. The inclined tip portion of the lead finger can be achieved by a stamping method as a final step in the forming process of the lead frame. The angle formed between the inclined top surface of the tip portion with a horizontal plane of the lead finger is normally less than 30°, and preferably between about 5° and about 30°, and more preferably between about 5° and 20°.

When a high electrical conductivity metal wire is bonded in a wire bonding process between an IC die and an inclined tip portion, the thermal stress occurring at the interface between the bonding wire, i.e., a gold wire and the inclined tip portion is reduced by at least 20% when tested in a thermal cycling test between 150° C. and −65° C. and when compared to a wire bond formed on a leveled tip portion of a finger lead. It is more preferred to achieve a reduction of 50% of the thermal stress such that the IC package formed can pass a thermal cycling test.

The present invention further discloses an integrated circuit chip package wherein an IC chip is bonded to a lead frame equipped with an inclined tip portion on its lead finger. The inclined tip portions of lead fingers contributes to a thicker wedge bond formation at the inclined portion and a resulting higher thermal stress resistance during a thermal cycling test. The inclined tip portion of the lead fingers may have an angle of smaller than 30° when measured from a horizontal plane of the lead finger, and preferably an angle between about 5° and about 20°. The lead frame can be formed of a thin metal film made of copper or a copper alloy. The lead frame is normally formed in a chemical etching process after a lithographic process for defining a pattern of the lead fingers. The IC package further includes high electrical conductivity metal wires, such as gold wires for providing electrical communication between each of the inclined tip portions of lead fingers with a corresponding bond pad on an IC die.

Figure 1:
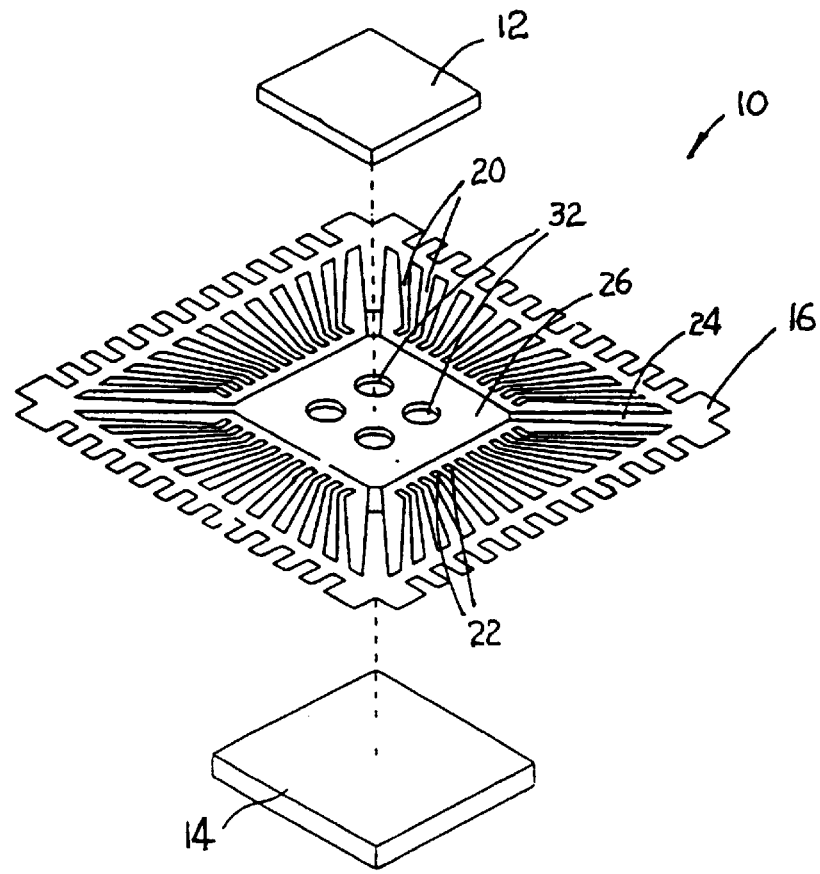
FIG. 1 is an enlarged, perspective view of a typical lead frame equipped with lead fingers and a die paddle, an IC die and a heat sink.
Figure 1A:
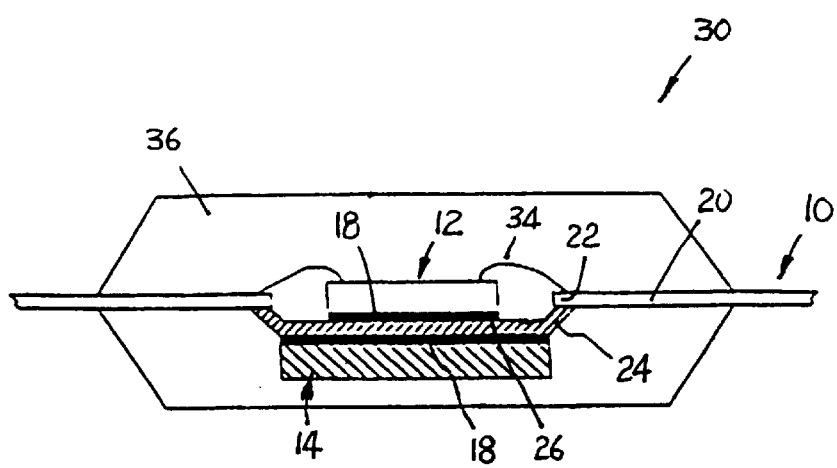
FIG. 1A is an enlarged, cross-sectional view of an encapsulated IC package of the components shown in FIG. 1 after a wire bonding process is first conducted.
Figure 1C:
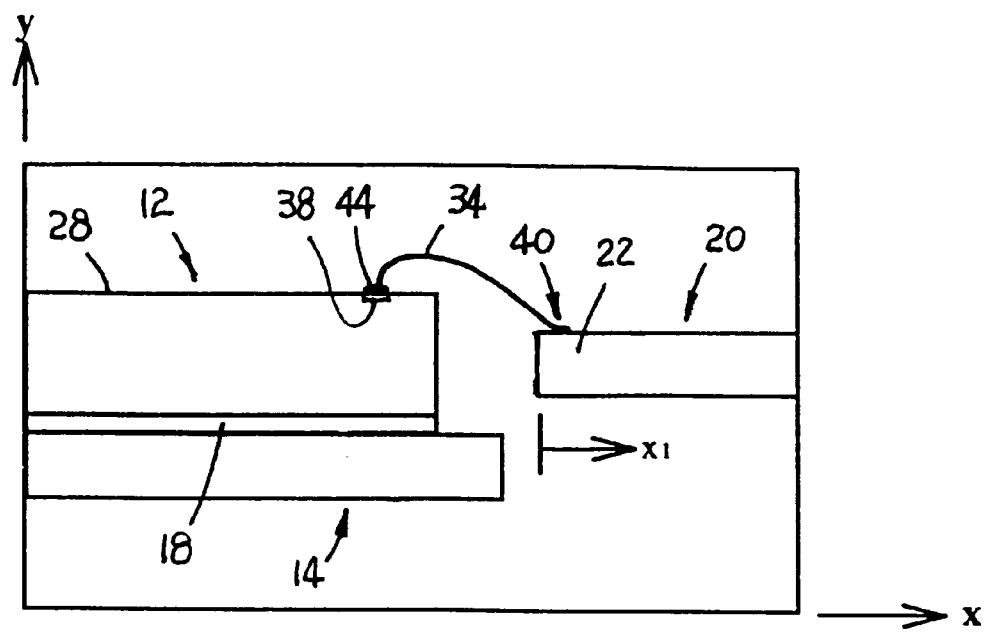
FIG. 1C is an enlarged, side view of a wedge bond formed on the tip portion of a lead finger by the conventional method.
Figure 1C:
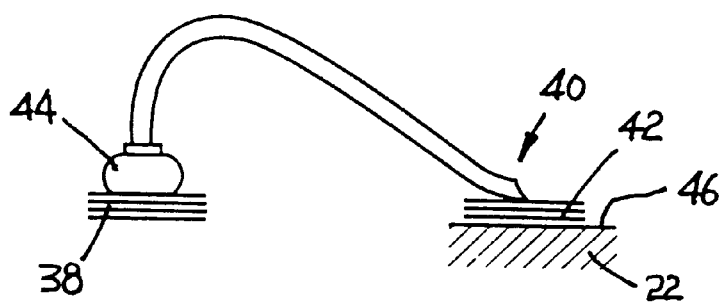
Figure 2:
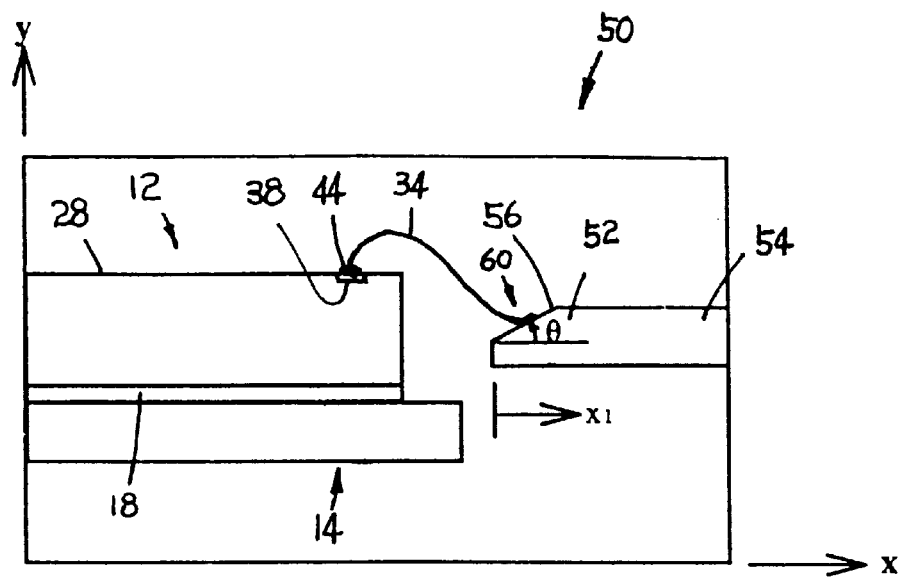
FIG. 2 is an enlarged, partial cross-sectional view of the present invention wire bond formed on an inclined tip portion of a lead finger.

Referring now to FIG. 2, wherein an enlarged, partial cross-sectional view of a present invention IC package 50 is shown. The tip portion 52 of the lead finger 54 is provide with an inclined top surface 56 which forms an angle θ with a horizontal plane of the lead finger 54. A gold wire 34 bonds a bond pad 38 on the top surface 28 of the IC die 12 to the inclined top surface 56 of the tip portion 52 forming an improved wedge bond 60. It has been noticed that the wedge bond 60 formed on the inclined top surface 56 is thicker than that normally formed on a leveled tip portion (shown in FIG. 1C). The thicker wedge bond further contributes to a higher bond strength and a higher thermal shock resistance of the bond. When the wedge bond 60 is tested in a standard thermal cycling test, i.e., a JEDEC thermal cycling test in a temperature loading from 150° C. to −65° C., the thermal stress produced in the wedge bond 60 is reduced by at least 20%.

Figure 3:
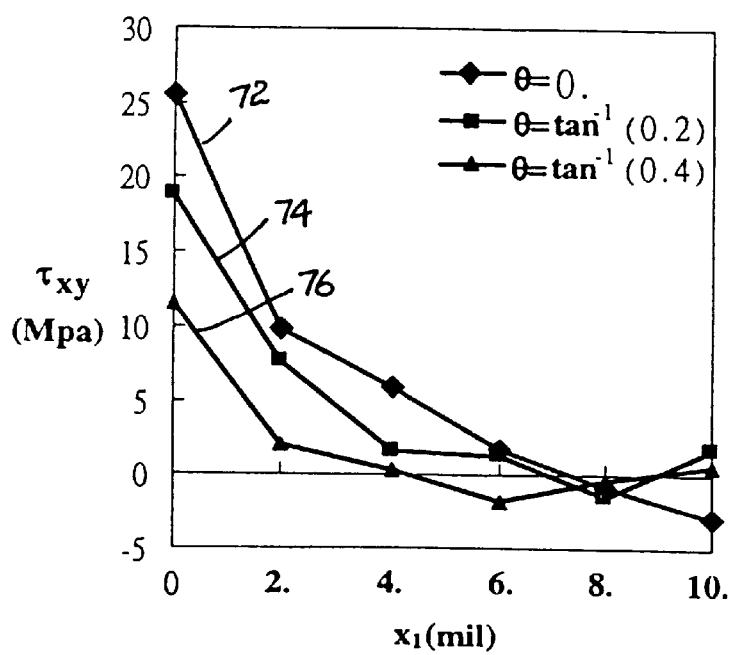
FIG. 3 is a graph illustrating the reduction in thermal stresses on an inclined tip portion as a function of distance from the tip of a lead finger.

Test data obtained on samples incorporating the present invention novel bonding technique and test data obtained on standard control samples (having a leveled tip portion on the lead fingers) are shown in FIG. 3. A graph illustrating a thermal stress dependence on the location in a tip portion of a lead finger at two angles of incline and a standard control sample which has a leveled top surface are shown in FIG. 3. Curve 72 indicates data obtained on the thermal stress with a wedge bond formed on a leveled tip portion (θ=zero) such as that shown in FIG. 1C. Data obtained on an inclined tip portion of a lead finger which as an inclined angle of approximately 10° is shown by curve 74. Data obtained on an inclined tip portion of a lead finger where the inclined angle is approximately 20° is shown by curve 76. It is self-evident that a significant drop in the thermal stress produced in the wedge bond formed on an inclined tip portion is achieved by close examinations of curves 72, 74 and 76. For instance, at a distance of 4 mils from the tip of a finger a reduction of approximately 95% in the thermal stress produced in the wedge bond is achieved with an inclined angle of 20° formed on the inclined tip portion of the finger lead.

The present invention novel method and the advantageously formed IC package by the method are amply demonstrated in the above descriptions and in the appended drawings of FIGS. 2 and 3. It should be noted that while the present invention method is illustrated in the formation of lead fingers in a lead frame, the method may be equally applied to other bonding sites which do not utilize lead fingers to produce the same desirable result.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teaching to other possible variations of the inventions.

The embodiment of the invention in which an exclusive property or privilege is claimed are defined as follows:

What is claimed is:

1. A lead frame equipped with lead fingers that have inclined tip portions for improved wire bonding comprising:
    an outer frame having a plurality of lead fingers emanating therefrom, and
    a plurality of lead fingers each having a base portion integral with said outer frame and a tip portion extending inwardly toward a center of said lead frame, said tip portion having a top surface that is formed with an angle smaller than 30° when measured from a horizontal plane of said lead finger.

2. A lead frame equipped with lead fingers that have an inclined tip portion according to claim 1, wherein said tip portion having a top surface that is framed with an angle between about 5° and about 30° when measured from a horizontal plane of said lead finger.

3. A lead frame equipped with lead fingers that have an inclined tip portion according to claim 1, wherein said tip portion having a top surface that is formed preferably with an angle between about 5° and about 20° when measured from a horizontal plane of said lead finger.

4. A lead frame equipped with lead fingers that have an inclined tip portion according to claim 1, wherein said angle of the top surface of the tip portion is formed in a stamping process.

5. A lead frame equipped with lead fingers that have an inclined tip portion according to claim 1, wherein said inclined tip portion of the lead finger is bonded to a gold wire in a wire bonding process.

6. A lead frame equipped with lead fingers that have an inclined tip potion according to claim 1, wherein said inclined tip portion of the lead finger reduces thermal stress by at least 20% formed at an interface between a subsequently bonded gold wire and said inclined tip portion during a thermal cycling test conducted between 150° C. and −65° C.

7. A lead frame equipped with lead fingers that have an inclined tip portion according to claim 1, wherein said inclined tip portion of said lead fingers reduces thermal stress by at least 50% at an interface formed between a subsequently bonded gold wire and said inclined tip portion during a thermal cycling test conducted between 150° C. and −65° C.

8. A lead frame equipped with lead fingers that have an inclined tip portion according to claim 1, wherein said lead frame is formed of copper, copper alloy or nickel-iron alloy.

9. An integrated circuit (IC) chip package having an IC chip bonded to lead frame comprising:
   a lead frame having a plurality of lead fingers emanating from said frame, each of said lead fingers having an inclined tip portion forming an angle of not more than 30° when measured from a horizontal plane of said lead finger,
   an IC chip having a plurality of bond pads provided on a top surface;
   a plurality of high conductivity wires providing electrical communication between each of said inclined tip portion of said lead fingers with a corresponding bond pad on said chip, and
   a plastic encapsulation compound encasing said lead frame and said IC chip.

10. An integrated circuit package having an IC chip bonded to a lead frame according to claim 9, wherein said inclined tip portion of said plurality of lead fingers forms an angle between about 5° and about 20° when measured from a horizontal plane of said lead finger.

11. An integrated circuit package having an IC chip bonded to a lead frame according to claim 9, wherein said inclined tip portion forms an angle with a horizontal plane of the lead finger that is sufficiently large such that after a high conductivity wire is bonded to said inclined tip portion forming an interface, a thermal stress occurring at said interface is reduced by at least 20% when compared to data obtained on a non-inclined tip portion during a thermal cycling test conducted between about 175° C. and about −65° C.

12. An integrated circuit package having an IC chip bonded to a lead frame according to claim 9, wherein said lead fingers are formed by an etching or stamping process and said inclined tip portions are formed by a stamping process.

13. An integrated circuit package having an IC chip bonded to a lead frame according to claim 9, wherein said lead frame is formed of copper, copper alloy or nickel-iron alloy in an etching process.

14. An integrated circuit package having an IC chip bonded to a lead frame according to claim 9, wherein said high conductivity wires providing electrical communication between each of said inclined tip portions with a corresponding bond pad on the chip are gold wires.

\* \* \* \* \*